United States Patent [19]

Ishida et al.

[11] Patent Number: 4,502,148
[45] Date of Patent: Feb. 26, 1985

[54] FM STEREO DEMODULATOR FOR DEMODULATING STEREO SIGNALS DIRECTLY FROM AN FM INTERMEDIATE FREQUENCY SIGNAL

[75] Inventors: Kohji Ishida; Tadashi Noguchi; Tatsuo Numata, all of Tokyo, Japan

[73] Assignee: Pioneer Electronic Corporation, Tokyo, Japan

[21] Appl. No.: 392,129

[22] Filed: Jun. 25, 1982

[30] Foreign Application Priority Data

Jun. 26, 1981 [JP] Japan ................................ 56-99922
Jun. 26, 1981 [JP] Japan ................................ 56-99924

[51] Int. Cl.$^3$ ............................................. H04H 5/00
[52] U.S. Cl. ........................................ 381/7; 381/13; 381/4
[58] Field of Search .................. 307/529; 329/50, 146, 329/147, 124; 332/37 R, 41; 381/1–4, 7, 10, 13, 8, 9

[56] References Cited

U.S. PATENT DOCUMENTS 3,514,719  5/1970  Rhodes .................................. 329/50
4,069,398  1/1978  Fujie .................................... 381/7
4,334,125  6/1982  Inoue ................................ 329/50 X
4,362,906 12/1982  Ishida ................................... 381/7
4,404,430  9/1983  Ogita .............................. 329/124 X

FOREIGN PATENT DOCUMENTS 56-47140  4/1981  Japan .................................... 381/7

Primary Examiner—Gene Z. Rubinson
Assistant Examiner—W. J. Brady
Attorney, Agent, or Firm—Fleit, Jacobson, Cohn & Price

[57] ABSTRACT

Disclosed is an FM stereo demodulator in which components of the demodulated signal corresponding to odd harmonics of the subcarrier signal are eliminated.

In order to prevent the production of odd harmonics, the multiplication between positive and negative sinusoidal subcarrier signals is performed with a stereo pilot signal and positive and negative pulse train signals produced by pulse detection of an FM signal.

The multiplication signals are further added with each other to directly reproduce left and right stereophonic signals.

4 Claims, 17 Drawing Figures

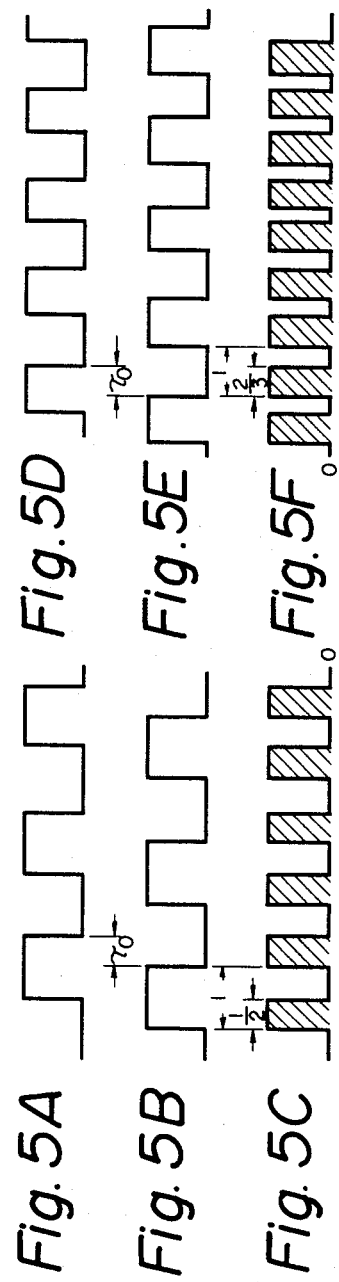
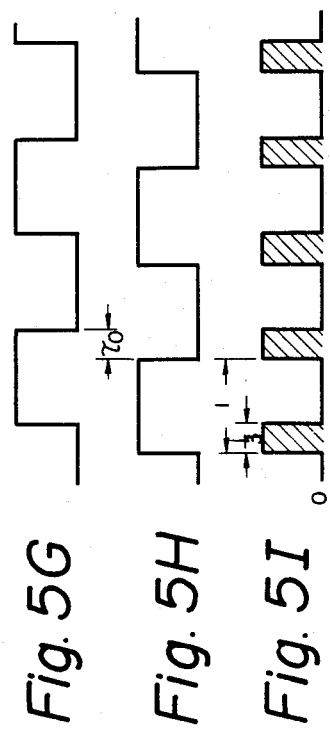

FM STEREO DEMODULATOR FOR DEMODULATING STEREO SIGNALS DIRECTLY FROM AN FM INTERMEDIATE FREQUENCY SIGNAL

BACKGROUND OF THE INVENTION

1. Field of the Invention

The present invention relates to an FM stereo demodulator for reproducing left and right signals, and more specifically to an FM stereo demodulator in which multiplication of an FM detection signal and a subcarrier signal is effected to reproduce the left and right signals.

2. Description of the Prior Art

FM stereo demodulators, for use in a stereophonic FM receiver for reproducing left and right signals, are divided into several types.

Among those prior art FM stereo demodulators, a switching type demodulator is popularly used.

In the switching type FM stereo demodulator, left and right signals are reproduced in a manner that a composite signal (FM detector output signal) is switched by a square-wave subcarrier signal of 38 kHz which is derived from a pilot signal contained in the composite signal.

Since the square-wave subcarrier signal includes frequency components of odd harmonics of the fundamental 38 kHz signal, such as 38×3=114 kHz, 38×5=190 kHz, there is a problem that a beat-frequency disturbance may occur between the odd harmonics of the subcarrier signal and a component of the intermediate frequency signal originating from a neighboring station.

In order to eliminate the beat-frequency disturbance, it is necessary to provide a so called anti-birdie filter (a kind of low pass filter) at an entrance of the stereo demodulation stage.

However, the use of low pass filters causes such problems as deterioration of the delay characteristic of the circuitry which extracts signal components from the composite signal and the reduction of amplitude of composite signal at higher frequency range thereof, which results in the deterioration of separation characteristics, and increase in the distortion of reproduced stereophonic signal.

Furthermore, signals passed through a low pass filter may involve distortions due to non-linearity of magnetic core material of the low pass filter.

SUMMARY OF THE INVENTION

An object of the present invention, therefore, is to eliminate the above-mentioned drawbacks of the prior art FM stereo demodulators, and to provide an FM stereo demodulator without need of low pass filters having adverse affects on the signal transmission.

Another object of the present invention is to provide an FM stereo demodulator having an excellent high-fidelity stereophonic signal demodulation.

According to the present invention, an FM stereo demodulator for reproducing left and right stereophonic signals from an FM signal comprises pulse signal generating means for generating an in-phase and an antiphase pulse train signal having a constant pulse width and having spectrum components of an FM composite signal in accordance with the FM signal, subcarrier generating means for generating an in-phase and an antiphase sinusoidal subcarrier signal synchronized with an FM pilot signal contained in the FM composite signal, first mixer means for mixing at least a multiplication signal of the in-phase pulse train signal and the antiphase sinusoidal subcarrier signal with a multiplication signal of the antiphase pulse train signal and the in-phase sinusoidal subcarrier signal, and second mixer means for mixing at least a multiplication signal of the in-phase pulse train signal and the in-phase sinusoidal subcarrier signal with a multiplication signal of the antiphase pulse train signal and the antiphase sinusoidal subcarrier signal, thereby reproducing the left and right signals from the output signals of the first and second mixer means, respectively.

The foregoing and other objects and advantages of the present invention will become more clearly understood upon review of the following description taken in conjunction with the accompanying drawings.

BRIEF DESCRIPTION OF THE DRAWINGS

FIGS. 5A through 5I are diagrams showing the wave forms of the output signals of each circuit of the pulse detectors shown in FIG. 2;

DETAILED DESCRIPTION OF THE PREFERRED EMBODIMENTS

Figure 1:
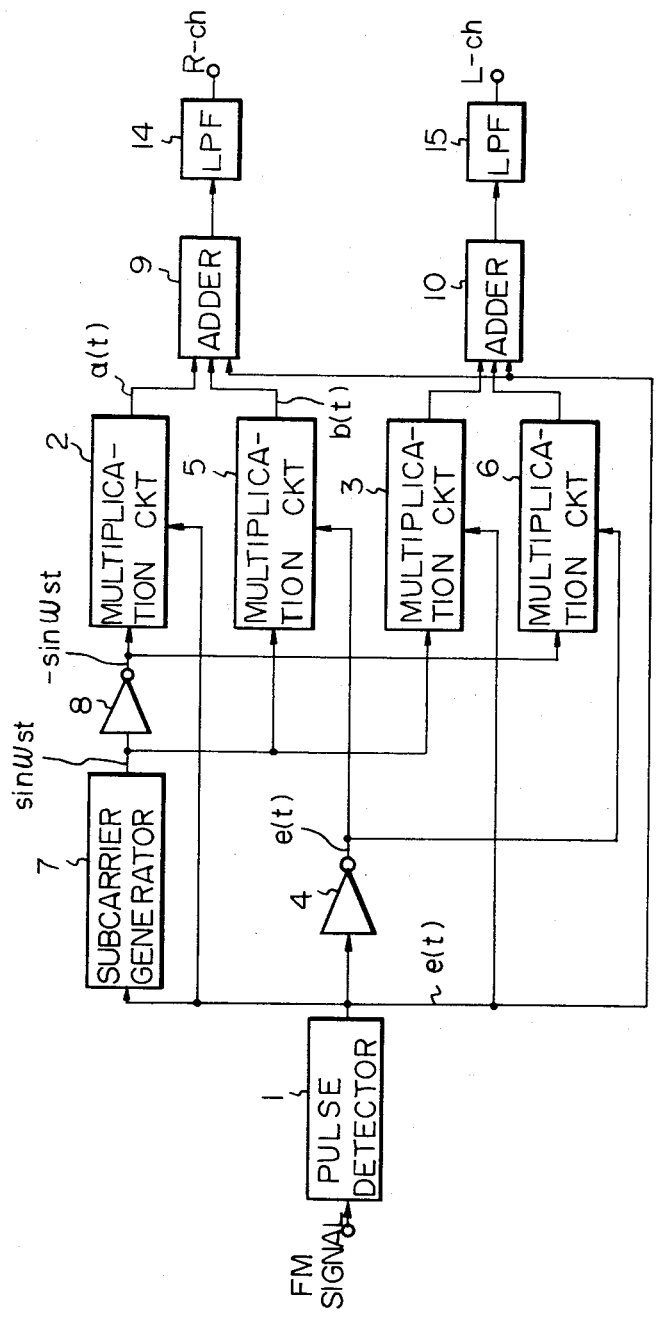
FIG. 1 is a block diagram of a first embodiment of the FM stereo demodulator according to the present invention.

Reference is first made to FIG. 1 in which the first embodiment is illustrated.

As shown, the FM stereo demodulator comprises a pulse detector 1 which receives an FM signal such as an FM intermediate frequency signal.

The pulse detector 1 produces a pulse train signal containing a spectrum component of an FM stereo composite signal which is applied to multiplication circuits 2 and 3 as a switching signal.

The pulse train signal is also applied to multiplication circuits 5 and 6 as a switching signal via an inverter 4.

A subcarrier generator 7 which receives the pulse train signal produced by the pulse detector 1 is provided for generating a sinusoidal subcarrier signal from a stereo pilot signal component of the composite signal contained in the pulse train signal.

The sinusoidal subcarrier signal produced by the subcarrier generator 7 is applied directly to the multiplication circuits 3 and 5, and to the multiplication circuits 2 and 6 via an inverter 8.

Output signals of the multiplication circuits 2 and 5 are applied to an adder 9 which also receives the in-phase pulse train signal from the pulse detector 1.

Similarly, output signals of the multiplication circuits 3 and 6 are applied to an adder 10 which also receives the in-phase pulse train signal from the pulse detector 1.

Output signals of the adders 9 and 10 are respectively supplied to low pass filters 14 and 15 so as to provide the left and the right signals.

Figure 2:
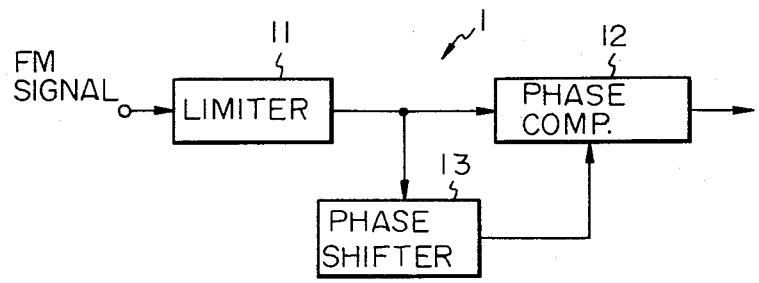
FIG. 2 is a block diagram of an example of the pulse detector shown in FIG. 1.

Turning to FIG. 2, an example of pulse detector 1 will be described.

The shown pulse detector takes the form of a quadrature detector circuit and comprises a limiter 11, which receives the FM signal, a phase shifter 13 connected to an output of the limiter 11, and a phase comparator 12 which receives output signals from the limiter 11 and the phase shifter 13 and produces the pulse train signal.

Figure 3:
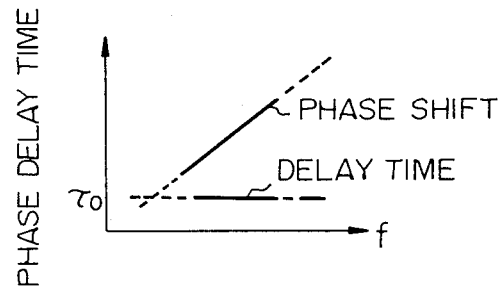
FIG. 3 is a diagram showing the characteristic of the pulse detector shown in FIG. 2.

The phase shifter 13 has an output characteristic with respect to the frequency of the input signal as shown in FIG. 3, that is, a constant delay time to and a phase shift variable with the frequency of the input signal. Thus, the phase shifter 13 is equivalent to a kind of a delay circuit.

Figure 4:
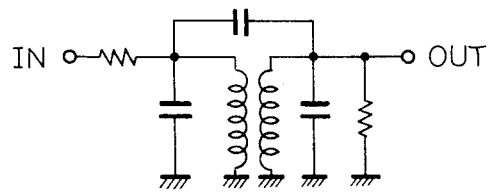
FIG. 4 is a circuit diagram of an example of the phase shifter shown in FIG. 2.

FIG. 4 shows an example of the circuit construction of the phase shifter 13.

If the phase shift amount of the phase shifter 13 is determined 90° against the central frequency of the FM intermediate frequency signal, i.e., the frequency of FM IF carrier signal, then the wave forms shown in FIGS. 5A through 5I can be observed.

FIGS. 5A, 5D and 5G show wave forms at the output of the limiter 11. FIGS. 5B, 5E and 5H show wave forms at the output of the phase shifter 13. Similarly, FIGS. 5C, 5F and 5I show wave forms at the output of the phase comparator 12.

Referring to FIGS. 5A through 5C, if the input FM signal has a frequency equal to the frequency of the FM IF carrier signal, 10.7 MHz for example, the output signal of the phase comparator 12 becomes a square-wave pulse train having a duty cycle of ½ as shown in FIG. 5C.

Therefore, the pulse train has a ½ dc component under this condition of input signal frequency (as indicated by dashed lines in FIG. 5C).

If the input FM signal has a frequency higher than the frequency of the FM IF carrier signal (see FIGS. 5D through 5F), the output signal of the phase comparator 12 becomes a rectangular pulse train having a duty cycle higher than ½, such as ⅔, as shown in FIG. 5F.

In such a case, the dc component of the pulse train is present ⅔ of the time, as shown by dashed lines in FIG. 5F; this means that there is an increase by the amount of 1/6 from a central value of ½ shown in the above case.

Conversely, if the input FM signal has a frequency lower than the frequency of the FM IF carrier signal (see FIGS. 5G through 5I), the output signal of the phase comparator 12 becomes a rectangular pulse train having a duty ratio less than ½, such as ⅓, as shown in FIG. 5I.

Thus, the dc component of the pulse train is present ⅓ of the time as shown by dashed lines in FIG. 5I; this means that there is a decrease by the amount of 1/6 from the central value of ½.

As explained above, the pulse train signal produced by the pulse detector 1 is a pulse position modulation (PPM) signal modulated by the input FM signal, which would be integrated to produce an FM detection signal in the case of prior art systems.

Since the pulse train signal from the pulse detector 1 contains the components of the stereo composite signal, it is directly applied to the multiplication circuits 2, 3, 5 and 6 as switching signals, as described hereinbefore.

In addition, it is to be noted that besides the above-described quadrature detector circuit, a PPM signal involving the stereo composite signal can be produced by various circuits such as a pulse count detector circuit.

The operation of the first embodiment will be described mathematically hereinbelow.

Low frequency component, e(t) i.e. the component of the composite signal, of the pulse train (PPM signal) is expressed as follows:

$$e(t) = V_o + \alpha \left[ M(t) + S(t)\sin \omega_s t + P \sin \frac{\omega_s t}{2} \right] \quad (1)$$

in which Vo is a dc component which varies the tuning condition, $\omega_S$ is an angular frequency of the subcarrier signal, M(t) is a main signal L(t)+R(t), S(t) is a sub signal L(t)−R(t), and α, P are constants.

If the delay time of the phase detector 1 is determined so that the phase transfer value against the input signal having a frequency equal to that of the FM IF carrier signal (which is obtained if correctly tuned) is 90°, then Vo is ½ as explained hereinbefore.

$\rho o$ is a constant proportional to the delay time or the gradient of the curve of the phase shift in FIG. 3, and corresponds to the efficiency of the detector circuit.

The output signal $\overline{e(t)}$ of the inverter 4 is as follows:

$$\overline{e(t)} = (1 - V_o) - \alpha \left[ M(t) + S(t) \sin \omega_s t + P \sin \frac{\omega_s t}{2} \right] \quad (2)$$

Therefore, the output signal a(t) of the multiplication circuit 2 is as follows:

$$a(t) = -\sin\omega_s t \left[ V_o + \alpha \left( M(t) + S(t)\sin\omega_s t + P\sin \frac{\omega_s t}{2} \right) \right] \quad (3)$$

Similarly, the output signal b(t) of the multiplication circuit 5 is as follows:

$$b(t) = \sin\omega_s t \cdot \left[ (1-V_o) - \alpha \left( M(t) + S(t)\sin\omega_s t + P\sin \frac{\omega_s t}{2} \right) \right] \quad (4)$$

The output signal of the adder 9 is therefore as follows:

$$a(t) + b(t) e(t) = V_o + \alpha M(t) + (1 - 2V_o) \sin \omega_s t \quad (5)$$
$$+ \alpha S(t) \sin\omega_s t - 2\alpha M(t) \sin \omega_s t$$
$$- 2\alpha S(t) \sin^2 \omega_s t + \alpha P \sin \frac{\omega_s t}{2}$$
$$- 2\alpha P \sin \omega_s t \cdot \sin \frac{\omega_s t}{2}$$

A term of the equation (5) is expressed as follows:

$$-2\alpha S(t) \sin^2 \omega_s t = -2\alpha S(t) \cdot \frac{1 - \cos 2\omega_s t}{2} = \qquad (6)$$

$$-\alpha S(t) + \alpha S(t) \cos 2\omega_s t$$

Furthermore, since $Vo = \frac{1}{2}$ at the correct tuning point, a term of equation $(1 - 2Vo) \sin \omega_s t = 0$ that means the constant component of the subcarrier is cancelled.

In view of equations (5) and (6) the output signal $R'(t)$ of the low pass filter 14, whereby the higher frequency components are rejected, is expressed as follows:

$$R'(t) = Vo + \alpha M(t) - \alpha S(t) = Vo = 2\alpha R(t) \qquad (7)$$

Thus, the right channel signal is separately reproduced.

Similarly, the left channel signal is separately reproduced at the output of the low pass filter 15.

Figure 6:
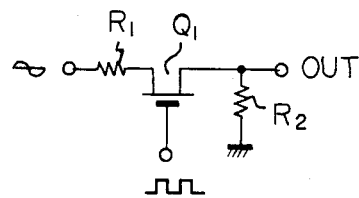
FIG. 6 is a circuit diagram of an example of the multiplication circuit.

FIG. 6 shows an example of multiplication circuits 2, 3, 5, and 6.

As shown, the multiplication circuit comprises a switching transistor $Q_1$ which receives at its base the pulse train signal $e(t)$ or $\overline{e(t)}$ as a control signal and an incoming signal through resistor $R_1$. Transistor $Q_1$ produces an output signal across an output resistor $R_2$.

Figure 7:
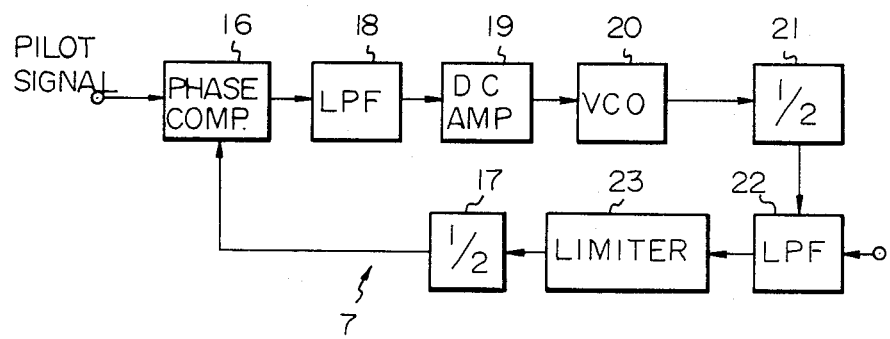
FIG. 7 is a block diagram of an example of a subcarrier generator.

Referring to FIG. 7, an example of the subcarrier generator 7 shown in FIG. 1 will be described.

The subcarrier generator shown in FIG. 7 takes the form of a phase locked loop (PLL) circuit and comprises a phase comparator 16 which receives the component of the stereo pilot signal contained in the pulse train signal from the pulse detector 1.

The phase comparator 16 also receives an output signal of a divide-by-two counter 17, thereby producing a differential output to control a voltage controlled oscillator (VCO) 20 via a low pass filter (LPF) 18 and a DC amplifier 19.

The voltage controlled oscillator 20 generates a square-wave (duty cycle is 50%) pulse train of 76 kHz which is applied to another divide-by-two counter 21.

An output signal of the counter 21 is applied to a low pass filter (LPF) 22 at which the same is transformed to a sinusoidal subcarrier signal of 38 kHz.

The output signal of the low pass filter 22 is applied to a limiter 23 to form a pulse signal to be applied to the divider 17 for producing the signal of 19 kHz applied to the phase comparator 16.

The sinusoidal subcarrier signal being synchronized with the stereo pilot signal is thus accurately produced.

Figure 8:
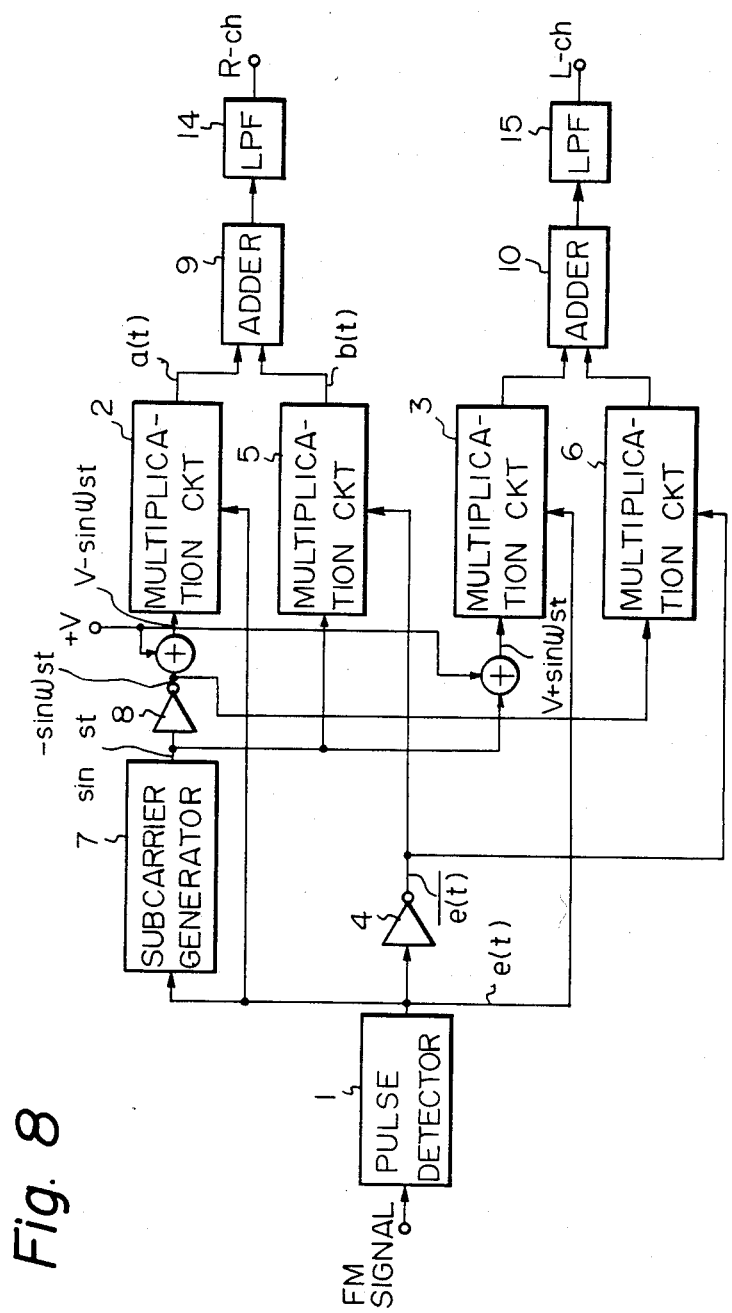
FIG. 8 is a block diagram of a second embodiment of an FM stereo demodulator according to the present invention in which a constant d.c. voltage is added to a pair of positive and negative sinusoidal subcarrier signals before the multiplication.

Referring to FIG. 8, the second embodiment of the present invention will be described.

The second embodiment features means for adding a constant dc component voltage V to inputs of the multiplication circuits 2 and 3, and the adder 9 and 10 add only the output signals of multiplication circuits 2 and 5, 3 and 6, respectively.

The operation of the second embodiment is mathematically described as hereinunder.

The output signal $a'(t)$ of the multiplication circuit 2 is expressed as follows:

$$a'(t) = (V - \sin\omega_s t)\left[Vo + \alpha\left(M(t) + S(t)\sin\omega_s t + P\sin\frac{\omega_s t}{2}\right)\right] \qquad (3)'$$

Similarly, the output signal $b'(t)$ of the multiplication circuit 5 is expressed as follows:

$$b'(t) = \sin\omega_s t \cdot \left[(1 - Vo) - \alpha\left(M(t) + S(t)\sin\omega_s t + P\sin\frac{\omega_s t}{2}\right)\right] \qquad (4)'$$

Therefore, the output signal of the adder 9 is as follows:

$$a'(t) + b'(t) = V \cdot Vo + V \cdot \alpha M(t) + V \cdot \alpha S(t) \sin \omega_s t \qquad (5)'$$
$$+ (1 - 2Vo) \sin \omega_s t - 2\alpha M(t) \sin \omega_s t$$
$$- 2\alpha S(t) \sin^2 \omega_s t + V \cdot \alpha \cdot P \sin \frac{\omega_s t}{2}$$
$$- 2\alpha P \sin \frac{\omega_s t}{2} \sin \omega_s t$$

Similar to the previous embodiment, the term $-2\alpha S(t) \sin^2 \omega_s t$ can be rewritten as follows:

$$-2\alpha S(t) \sin^2 \omega_s t = -2\alpha S(t) \cdot \frac{1 - \cos 2\omega_s t}{2} = \qquad (6)$$

$$\alpha S(t) + \alpha S(t) \cos 2\omega_s t$$

Thus, the constant component of the subcarrier is cancelled and the output signal $R''(t)$ of the low pass filter 14 is as follows:

$$R''(t) = \frac{1}{2} V + V \cdot \alpha M(t) - S(t) \qquad (7)$$

in which, if the magnitude of the dc voltage V is 1, $$R'' = \frac{1}{2} + \alpha M(t) - \alpha S(t) = \frac{1}{2} + 2\alpha R(t) \qquad (8)$$

As shown by the equation (8) the right signal is reproduced at the output of the low pass filter 14.

Figure 9:
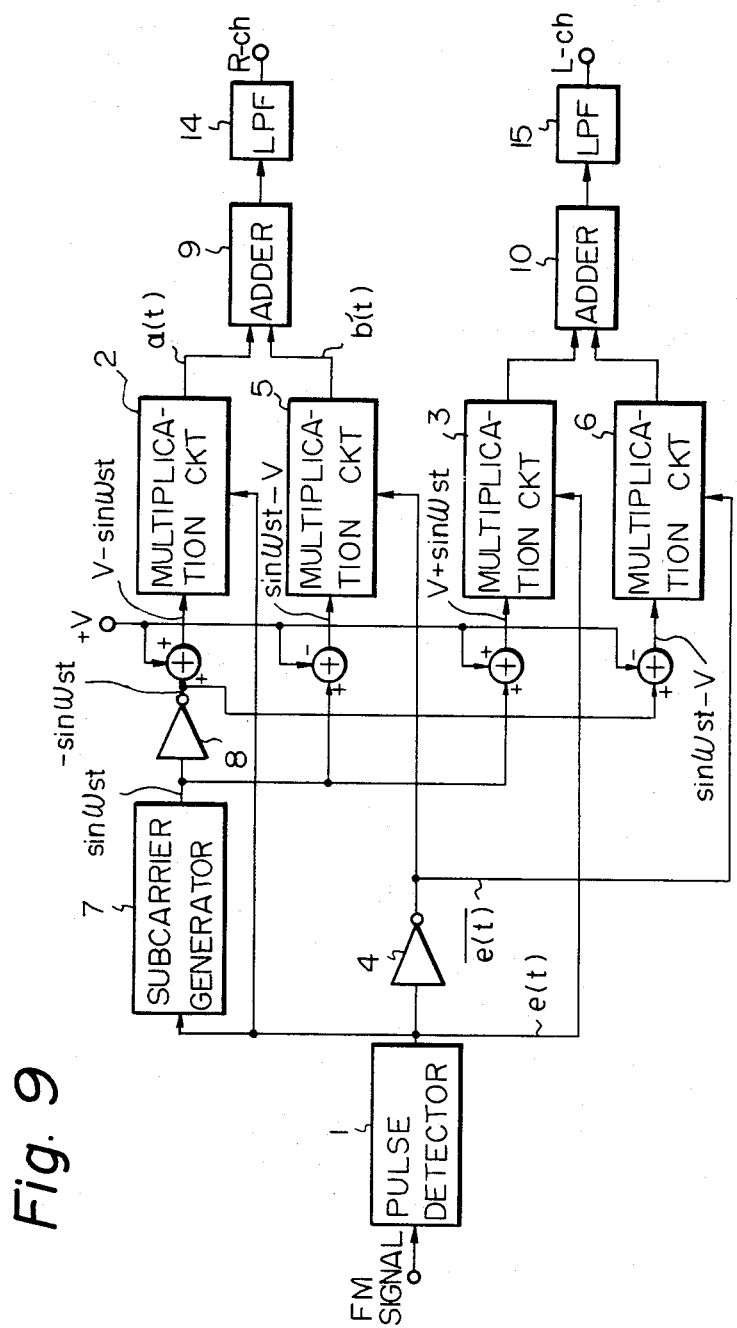
FIG. 9 is a block diagram of a third embodiment of an FM stereo demodulator according to the present invention in which a constant positive d.c. voltage is added to a pair of positive and negative sinusoidal subcarrier signals and a constant negative d.c. voltage is added to the other pair of positive and negative sinusoidal subcarrier signals before multiplication.

Turning to FIG. 9, the third embodiment according to the present invention will be described hereinunder.

The third embodiment features that a positive dc voltage $+V$ is applied to inputs of the multiplication circuits 2 and 3, and a negative dc voltage $-V$ is applied to inputs of the multiplication circuits 5 and 6. As illustrated in FIG. 9, the positive d.c. voltage $+V$ is applied to two adder means coupled to the inputs of multiplication circuits 2 and 3 and that voltage is applied to the negative terminals of two subtractor means coupled to the inputs of multiplication circuits 5 and 6.

In the third embodiment, the output signal $b''(t)$ of the multiplication circuit 5 is as follows:

$$b''(t) = (\sin\omega_s t - V) \cdot \qquad (9)$$

$$\left[(1 - Vo) - \alpha\left(M(t) + S(t)\sin\omega_s t + P\sin\frac{\omega_s t}{2}\right)\right]$$

Therefore, the output signal of the adder 9 is as follows:

$$a'(t) + b''(t) = V(2Vo - 1) + 2V \cdot \alpha M(t) + 2\alpha \cdot VS(t)\sin\omega_s t \qquad (10)$$
$$+ (1 - 2Vo) \sin\omega_s t - 2\alpha M(t) \sin\omega_s t$$
$$- 2\alpha S(t) \sin^2 \omega_s t + 2\alpha \cdot VP \sin \frac{\omega_s t}{2}$$

-continued $$-2\alpha P \sin\frac{\omega_s t}{2} \sin\omega_s t$$

If the $V_o = \frac{1}{2}$, then the dc components become zero. Therefore subcarrier component will be cancelled.

Further, if the d.c. voltage $V=1$, the output signal $R'''(t)$ of the low pass filter 14 is as follows:

$$R'''(t) = \alpha M(t) - \alpha S(t) = 2\alpha R(t) \qquad (11)$$

Thus, the right channel signal is reproduced.

It will be appreciated from the foregoing, that an FM stereo demondulator which is free from the beat frequency disturbance is provided by employing a single circuit construction.

Further, since the subcarrier component is electrically cancelled, the required characteristics of the low pass filters are rather simple, and therefore the low pass filters used in the circuit of the invention do not have any adverse effect on the signal transmission.

Above, preferred embodiments of the present invention have been described. It should be understood, however, that the foregoing description is for illustrative purposes only, and is not intended to limit the scope of the invention. Rather, there are numerous equivalents to the preferred embodiments, and such are intended to be covered by the appended claims.

What is claimed is:

1. An FM stereo demodulator for reproducing a first channel signal and a second channel signal from an FM intermediate frequency signal, said demodulator comprising:
   a pulse signal generating means for generating, from said FM intermediate frequency signal, a first pulse train signal and a second pulse train signal each having a constant pulse width and spectrum components corresponding to a stereo composite signal component of said FM intermediate frequency signal, said second pulse train signal being opposite in phase relative to said first pulse train signal;
   a subcarrier signal generating means responsive to one of said first and second pulse train signals, for selectively detecting a pilot signal component included in said one of first and second pulse train signals to generate a first sinusoidal subcarrier signal in phase with said pilot signal and a second sinusoidal subcarrier signal opposite in phase with said pilot signal;
   a first multiplication means for multiplying said first pulse train signal by said second sinusoidal subcarrier signal;
   a second multiplication means for multiplying said second pulse train signal by said first sinusoidal subcarrier signal;
   a third multiplication means for multiplying said first pulse train signal by said first sinusoidal subcarrier signal;
   a fourth multiplication means for multiplying said second pulse train signal by said second sinusoidal subcarrier signal;
   a first mixer means for additively mixing an output signal of said first multiplication means with an output signal of said second multiplication means to produce said first channel signal; and
   a second mixer means for additively mixing an output signal of said third multiplication means with an output signal of said fourth multiplication means to produce said second channel signal.

2. An FM stereo demodulator as claimed in claim 1, wherein said first and second mixer means further receive said first pulse train signal to additively mix the first pulse train signal with the output signals of the multiplication means.

3. An FM stereo demodulator as claimed in claim 1, further comprising a source of d.c. bias voltage, a first adder means connected between said subcarrier signal generating means and said first multiplication means for adding said d.c. bias voltage to said second sinusoidal subcarrier signal, and a second adder means connected between said subcarrier signal generating means and said third multiplication means for adding said d.c. bias voltage to said first sinusoidal subcarrier signal.

4. An FM stereo demodulator as claimed in claim 1, further comprising a source of d.c. bias voltage, a first adder means connected between said subcarrier signal generating means and said first multiplication means for adding said d.c. bias voltage to said sinusoidal subcarrier, a second adder means connected between said subcarrier signal generating means and said third multiplication means for adding said d.c. bias voltage to said first sinusoidal subcarrier signal, a first subtractor means connected between said subcarrier signal generating means and said second multiplication means for subtracting said d.c. bias voltage from said first sinusoidal subcarrier signal, and a second subtractor means connected between said subcarrier signal generating means and said fourth multiplication means for subtracting said d.c. bias voltage from said second sinusoidal subcarrier signal.

* * * * *